(12) United States Patent
Kobayashi (10) Patent No.: US 6,265,777 B1
(45) Date of Patent: Jul. 24, 2001

(54) SEMICONDUCTOR DEVICE WITH A LOW RESISTANCE WIRING LAYER COMPOSED OF A POLYSILICON AND A REFRACTORY METAL

(75) Inventor: Migaku Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/299,076

(22) Filed: Apr. 26, 1999

(30) Foreign Application Priority Data

May 1, 1998 (JP) .................................................. 10-122239

(51) Int. Cl.⁷ .................................................. H01L 23/48
(52) U.S. Cl. ........................... 257/757; 257/754; 257/755; 257/756
(58) Field of Search ..................................... 257/700–770

(56) References Cited

U.S. PATENT DOCUMENTS 5,425,392 * 6/1995 Thakur et al. ........................ 437/173

FOREIGN PATENT DOCUMENTS

| 63-283064 | 11/1988 | (JP) . |
| 7-283217 | 10/1995 | (JP) . |
| 9-306912 | 11/1997 | (JP) . |
| 94-27132 | 12/1994 | (KR) . |

* cited by examiner

*Primary Examiner*—Fetsum Abraham
(74) *Attorney, Agent, or Firm*—Sughrue, Mion, Zinn, Macpeak & Seas, PLLC

(57) ABSTRACT

A semiconductor device includes a polysilicon film formed directly or indirectly on a semiconductor substrate, and a refractory metal silicide film formed on the polysilicon film. The refractory metal silicide film comprises grains of refractory metal silicide. At least a portion of the grains has a maximum grain diameter equal to or larger than at least one of a film thickness of the refractory metal silicide film and a film width of the refractory metal silicide film.

10 Claims, 7 Drawing Sheets

SEMICONDUCTOR DEVICE WITH A LOW RESISTANCE WIRING LAYER COMPOSED OF A POLYSILICON AND A REFRACTORY METAL

BACKGROUND OF THE INVENTION

1. Field of the Invention

The present invention relates to a semiconductor device having a polycide wiring layer in which a high melting point metal silicide layer is laminated on a polysilicon layer. More particularly, the present invention relates to a semiconductor device and a method of manufacturing the same, in which a wiring layer resistance of a polycide wiring layer is reduced for realization of fine patterns and high speed operation in the semiconductor device.

2. Description of the Related Art

With the high integration in a semiconductor device, it is aimed for a wiring layer between semiconductor elements or between the element and an electrode to have a fine and thin structure. For example, it is required to reduce the wiring layer width from the range of 200 to 250 nm to the range of 40 to 100 nm. Therefore, the increase of wiring resistance with the formation of the fine and thin wiring layer can not be ignored, and the decrease of the wiring layer resistance is required.

For example, when the wiring layer is applied to a word line of a semiconductor memory device, the access time of the memory device becomes long, if the wiring layer resistance is large. For this reason, the length of the word line can not be made longer than a predetermined value. As a result, the number of memory elements connectable with the word line can not be increased.

In order to solve the above problem, one word line is divided into a plurality of blocks, and a word line drive signal is supplied to the word line in each block through a buffer. However, in this method, there is a problem in that the memory chip size becomes large.

In order to achieve the reduction of the wiring layer resistance, it could be considered that metal, especially, high melting point metal is used as a material of the wiring layer. However, this technique can not be applied, when it is necessary to use polysilicon as the wiring layer material, like the wiring layer used as a gate electrode in a MOS transistor of the semiconductor device. Therefore, as one approach to make the wiring layer resistance of the polysilicon layer low, a polycide wiring layer is conventionally proposed.

Figure 1A:
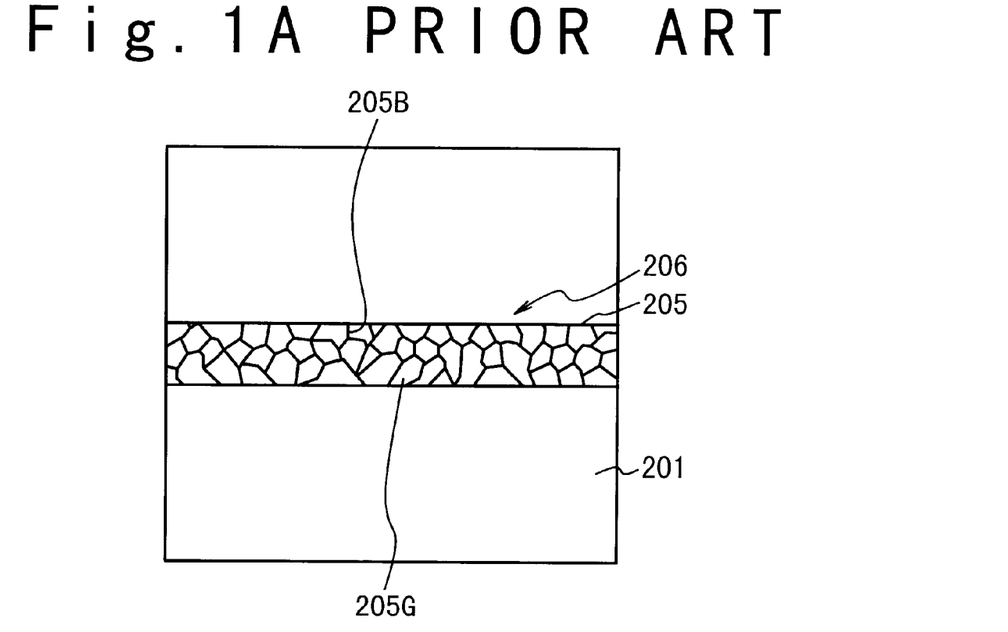
FIGS. 1A and 1B are a plan view and a cross sectional view of conventional polycide wiring layer, respectively.
Figure 1B:
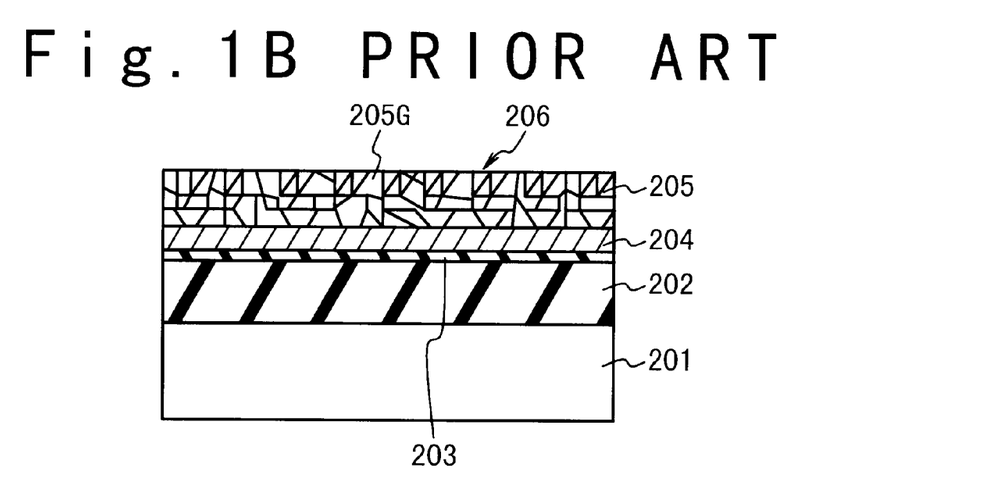

The polycide wiring layer structure is shown in FIGS. 1A and 1B as a plan view and a cross sectional view, respectively. A polysilicon layer 204 is formed above a silicon substrate 201 on which a trench separation insulating film 202 and a gate insulating film 203 have been formed. A high melting point metal silicide 205 is laminated on the polysilicon layer 204. The polysilicon layer 204 and the high melting point metal silicide layer 205 are patterned into a predetermined pattern to form a polycide wiring layer 206. Thus, it is realized to make the wiring layer resistance low by use of a low sheet resistance of the high melting point metal silicide.

In such a polycide wiring layer, impurity ions, e.g., phosphorus ions are doped into the polysilicon 204 to realize the low resistance of the polysilicon 204. Also, the high melting point metal silicide layer 205 is formed by a CVD method. The high melting point metal silicide is composed of a lot of needle-shape crystals formed on the polysilicon surface on the formation of the high melting point metal silicide layer 205. A thermal annealing process is applied to the needle-shape crystals such that the crystals grow. Thus, grains or particles 205G with a required grain diameter are obtained. The polycide layer formed in this way is etched and patterned into a requested pattern using the photolithography technique, so that the polycide wiring layer 206 is completed.

By the way, the inventor studied such a polycide wiring layer. Consequently, it was discovered that the polycide wiring layer was not made low in resistance. The inventor paid attention to tungsten silicide (WSi) as the high melting point metal silicide, especially, the grains of tungsten silicide and observed them with an electron microscope. As the result of observation, the grain size or grain diameter of the grain was small rather than the film thickness of the WSi layer and the film width of the WSi layer. Also, the grains were formed in the state in which the grains were arranged in the film thickness direction of the WSi layer and the width direction of the WSi layer.

That is, the composition ratio of tungsten (W) and silicon (Si) in the formation of the WSi layer would be as large as 1:2.5, from the condition in the formation of the WSi layer. Also, a thermal annealing process after the formation of the WSi layer was carried out under the condition of the temperature equal to or lower than 900° C. and annealing time of about 60 minutes. Therefore, it is inferred that Si atoms are deposited in the boundary between the grains, and the Si atoms function to hinder the growth of the grain.

Therefore, in an example shown in FIGS. 1A and 1B, Si atoms are deposited in the interface 205B between the grains 205G and the deposited Si atoms function to obstruct current flow between the grains. As a result, the sheet resistance of WSi layer becomes large. Also, when the polycide wiring layer is patterned, the wiring layer has the high resistance. It should be noted that the grain size or diameter means a maximum of the grain diameters in the present invention.

It should be noted that it is described in Japanese Laid Open Patent Application (JP-A-Heisei 7-283217) that the wiring layer resistance increases when the wiring layer has the width smaller than the grain size of titanium silicide (TiSi) in a titanium silicide layer. This does not correspond to the above studying by the inventor. This would be because of the difference between the reference and the present invention in manufacturing method. That is, in the reference, a thermal annealing process is carried out to form the TiSi layer after a titanium layer is deposited on a polysilicon layer. On the other hand, in the present invention, the WSi layer is formed on the polysilicon layer by the CVD method, to be described later.

Regardless of the cause, when the WSi grain size is smaller than the width and film thickness of the wiring layer, it is difficult to reduce the wiring layer resistance, as described above. Also, when the WSi layer is formed using a sputtering method, the grain diameter of the WSi grain is small. In order to increase the grain diameter of the WSi grain, it is necessary to perform the annealing process at a high temperature for a long time. However, when a gate wiring layer of the semiconductor device is formed of WSi, it is not possible to perform the annealing process for the long time, since the annealing process affects the diffusion layers of the source and drain.

SUMMARY OF THE INVENTION

An object of the present invention is to provide a semiconductor device and a method of manufacturing the same, in which a polycide wiring layer which is composed of a high melting point metal silicide having a low resistance.

In order to achieve an aspect of the present invention, a semiconductor device includes a polysilicon film formed directly or indirectly on a semiconductor substrate, and a refractory metal silicide film formed on the polysilicon film. The refractory metal silicide film comprises grains of refractory metal silicide. At least a portion of the grains has a maximum grain diameter equal to or larger than at least one of a film thickness of the refractory metal silicide film and a film width of the refractory metal silicide film.

It is preferable that the film thickness of the refractory metal silicide is in a range of 100 to 150 nm, the film width of the refractory metal silicide is in a range of 40 to 250 nm, and the maximum grain diameter is in a range of 150 to 200 nm.

The refractory metal silicide may be tungsten silicide (WSi). Also, it is preferable that the refractory metal silicide has a sheet resistance in a range of 2 to 4 $\Omega/\square$.

When the semiconductor device includes a gate insulating film formed on the semiconductor substrate, and the refractory metal silicide is formed on the gate insulating film, the polysilicon film and the refractory metal silicide preferably function a gate electrode of a MOS transistor and a wiring layer.

The semiconductor device may further include a coverage film formed on the refractory metal silicide, for suppressing growth of the grains in a direction of the film thickness. In this case, the coverage film may be a silicon oxide film.

In order to achieve another aspect of the present invention, a method of manufacturing a semiconductor device, includes:

forming a polysilicon film formed directly or indirectly on a semiconductor substrate;

forming a refractory metal silicide film formed on the polysilicon film;

performing heat treatment such that at least a portion of grains of the refractory metal silicide film has a maximum grain diameter equal to or larger than at least one of a film thickness of the refractory metal silicide film and a film width of the refractory metal silicide film; and patterning the polysilicon film and the refractory metal silicide after the heat treatment.

The refractory metal silicide film may be a tungsten silicide film. In this case, the step of forming a refractory metal silicide film includes reacting tungsten and silicon with a composition ratio in a range of 1:2.0 to 1:2.2.

Also, the step of performing heat treatment may include performing a rapid thermal annealing method at a temperature equal to or higher than 950° C. for a time equal to or shorter than 60 seconds. The step of performing a rapid thermal annealing method may include performing the rapid thermal annealing method at a temperature in range of 950 to 1000° C. for a time substantially equal to 60 seconds. The step of performing a rapid thermal annealing method may include performing the rapid thermal annealing method at a temperature in range of 1000 to 1100° C. for a time substantially equal to 15 seconds.

The step of performing heat treatment may include performing a rapid thermal annealing method such that the refractory metal silicide film has a sheet resistance in a range of 2 to 4 $\Omega/\square$.

The step of performing heat treatment may include performing a rapid thermal annealing method such that the maximum grain diameter is in a range of 150 to 200 nm.

In order to achieve still another aspect of the present invention, a semiconductor device includes a polysilicon film formed directly or indirectly on a semiconductor substrate, and a refractory metal silicide film formed on the polysilicon film to have a sheet resistance in a range of 2 to 4.

DESCRIPTION OF THE PREFERRED EMBODIMENTS

Next, a semiconductor device of the present invention will be described below in detail with reference to the attached drawings.

Figure 2:
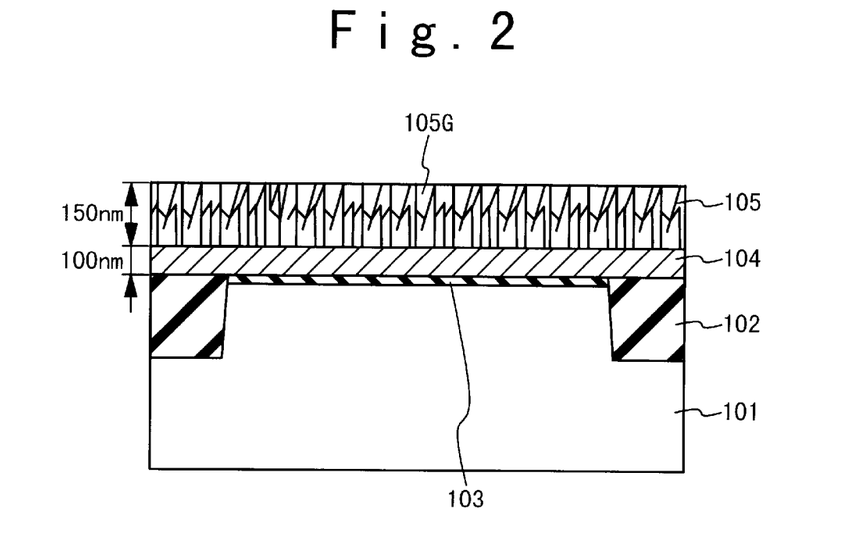
FIG. 2 is a cross sectional view of a semiconductor device to illustrate a film forming process in a method of manufacturing a semiconductor device of the present invention.

FIG. 2 is a cross sectional view of the semiconductor device according to the first embodiment of the present invention in the manufacturing process.

Referring to FIG. 2, a trench (concave structure) with a predetermined depth is formed in an element separation region on a silicon substrate 101. An insulation material film such as a silicon oxide film is embedded in the trench to form a trench separation insulating film 102. Also, a gate oxide film 103 of a silicon oxide film is formed on the surface of the silicon substrate 101 in an element forming region which is segmented by the trench separation insulating film 102. Subsequently, a polysilicon film 104 is formed on the gate oxide film 103 by an LP-CVD method to have the film thickness of 100 nm. The polysilicon film 104 is doped with phosphorus ions to decrease the resistance. Then, a tungsten silicide (WSi) film 105 is formed on the polysilicon film 104 by a CVD method to have the film thickness of 150 nm. The film forming condition is as follows: a mixture gas of $WF_6/SiH_2Cl_2$ is used, the temperature is in a range of 500 to 550° C., and the pressure is in a range of 80 to 100 Pa.

As a result, the WSi layer is formed to have the composition ratio of W and Si in a range of 1:2.0 to 1:2.2. The WSi layer is formed to be composed of a lot of needle-shaped crystals which are directed from the surface of the polysilicon film 104 toward an upper portion, as shown in the figure.

Figure 3:
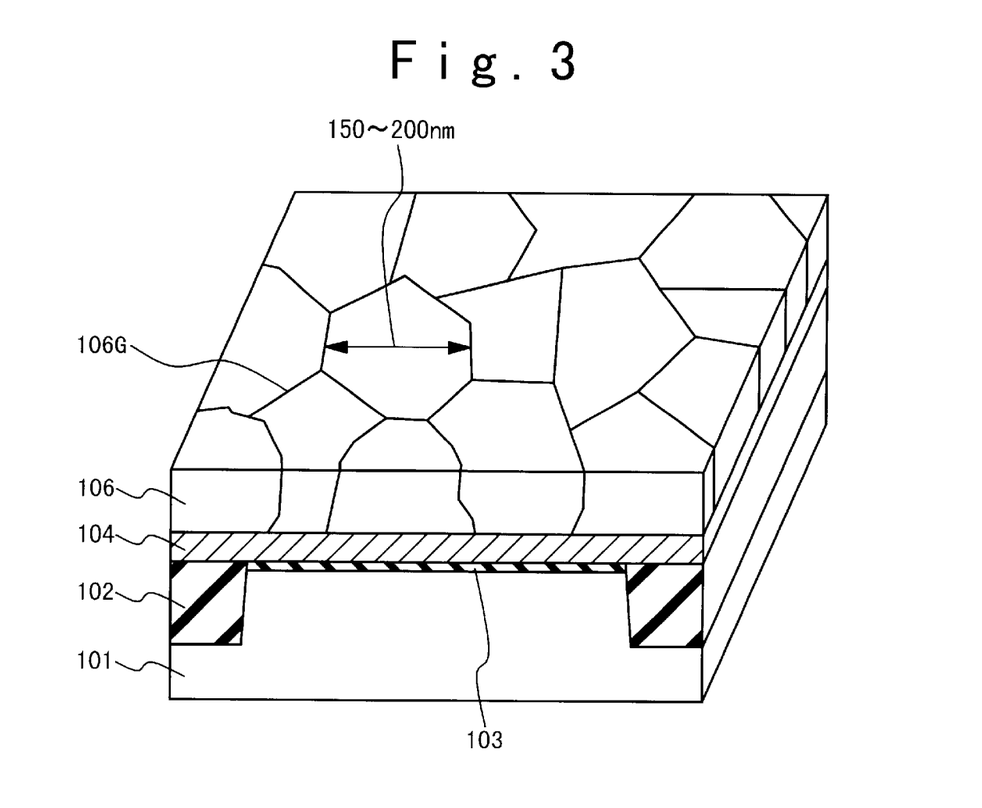
FIG. 3 is a schematically perspective view of the semiconductor device to illustrate a thermal annealing process of the method of manufacturing of the present invention.

Next, as show by a perspective view of FIG. 3, a thermal annealing process is carried out to the WSi layer 105 to grow the needle crystals 105G so that grains with large grain diameters are grown. The thermal annealing process is carried out at the temperature in a range of 950° C. to 1100° C. for 15 to 60 seconds in a nitrogen ambience by a rapid thermal annealing method (RTA) using a lamp annealing. Through the thermal annealing process, the grains of the WSi layer 105G are grown to have the grain diameters of 150 nm to 200 nm as the grains 106G.

Figure 4:
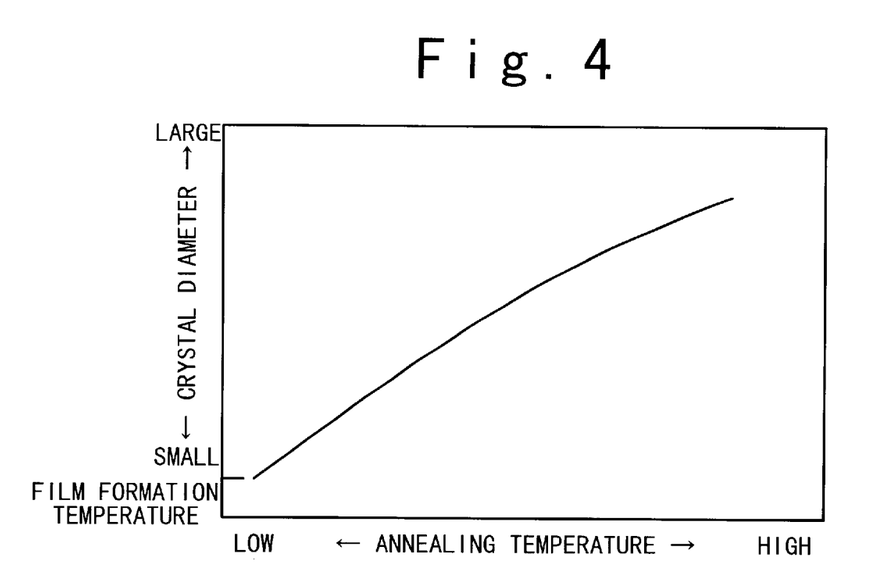
FIG. 4 is a diagram showing a relation of annealing temperature and grain diameter.

The relation between the annealing temperature and the grain diameters of the grains in the WSi layer is shown in FIG. 4. The result shown in FIG. 4 is obtained through the experiment by the inventor. Because the absolute values of the sizes of the needle crystals are different in the initial stage of the formation of the WSi layer, specific values are not indicated. However, it could be understood that the grain size becomes large as the thermal annealing temperature is increased. Also, it is confirmed that the sheet resistance of the WSi layer is reduced with the growth of the grain size, as shown in FIG. 5.

Figure 5:
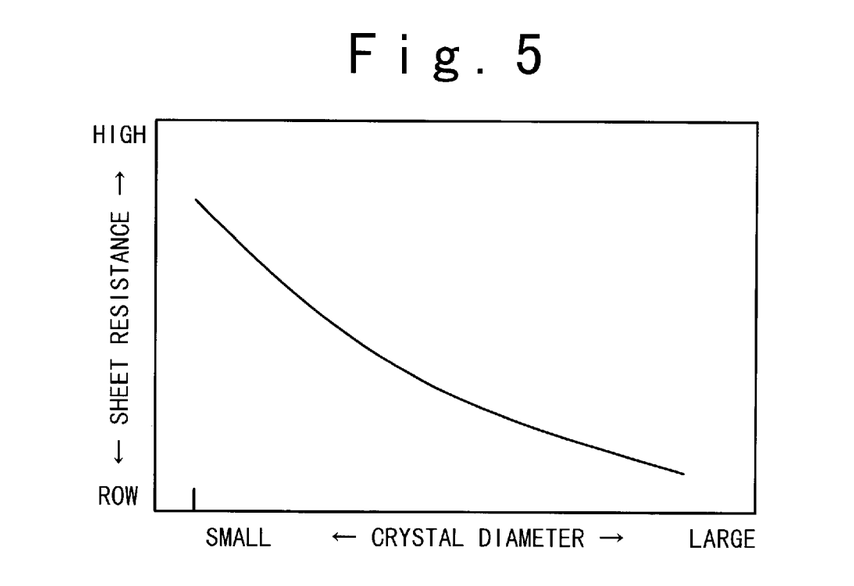
FIG. 5 is a diagram showing a relation of grain diameter and sheet resistance.
Figure 6:
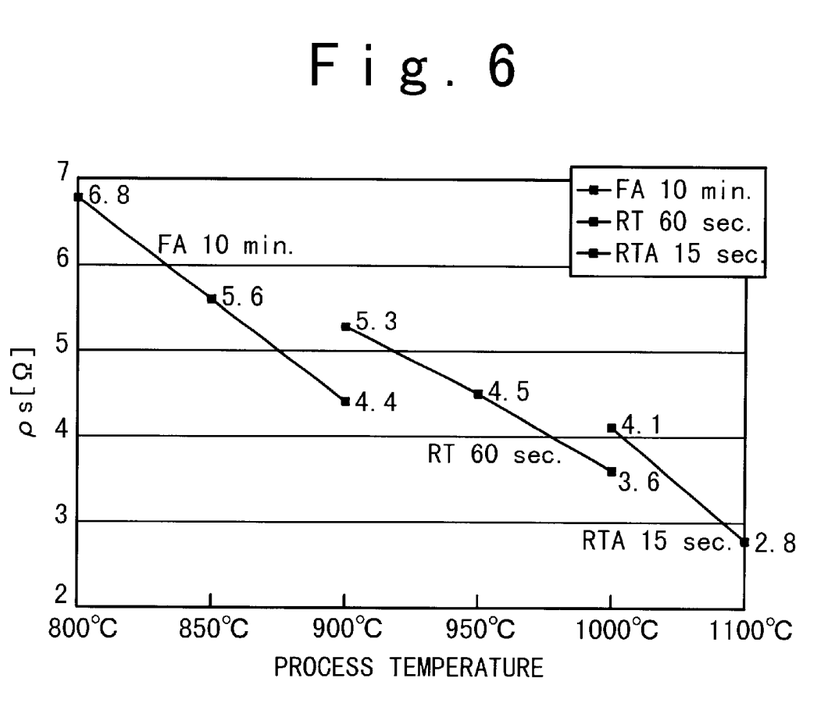
FIG. 6 is a diagram showing a relation of annealing condition and sheet resistance.

Three thermal annealing processes were carried out to samples, to verify the characteristics of FIGS. 4 and 5. They were a furnace annealing (FA) process at the temperature in a range of 800° C. to 900° C. for 10 minutes, a rapid thermal annealing (RTA) process at the temperature in a range of 900° C. to 1000° C. for 60 seconds, and the RTA process in a range of 1000° C. to 1100° C. for 15 seconds. FIG. 6 shows the experiment result for the sheet resistances of the WSi layers. As seen from the figure, the WSi layer with low sheet resistance is obtained when the rapid thermal annealing (RTA) process is carried out at higher temperature for a short time.

In the present invention, the WSi layer is obtained to have the sheet resistance of 2 to 4 Ω/□. For this purpose, the annealing condition is adopted of the rapid thermal annealing (RTA) temperature equal to or higher than 950° C. for 60 seconds, or the RTA time equal to or higher than 1000° C. for 15 seconds. If the annealing temperature is the same, as the annealing time becomes longer, the grain size becomes larger, so that the sheet resistance becomes low. Also, when the rapid thermal process is performed, any influence to the source and drain diffusion layers can be suppressed to the minimum.

Figure 7:
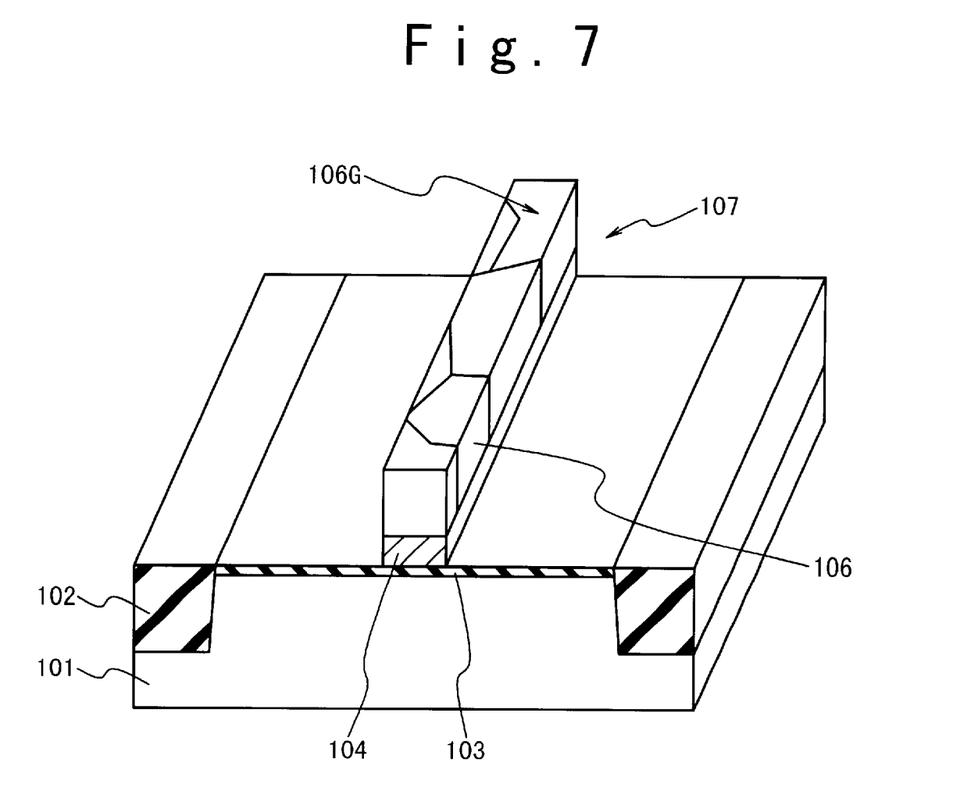
FIG. 7 is a perspective view of the semiconductor device to illustrate a polycide wiring layer manufactured in the present invention.

In this way, as shown in FIG. 7, the polycide layer in which the polysilicon layer 104 and the WSi layer 106 are laminated is selectively etched to have the width of 100 nm, so that a gate electrode 107 of polycide is formed.

Figure 8A:
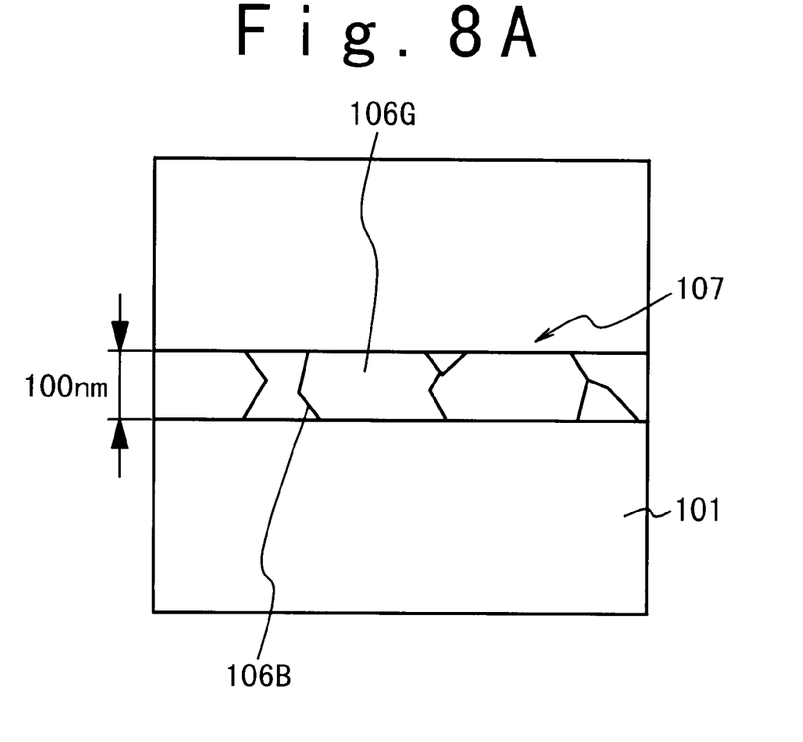
FIGS. 8A and 8B are a plan view and a cross sectional view of the semiconductor device shown in FIG. 6, respectively.
Figure 8B:
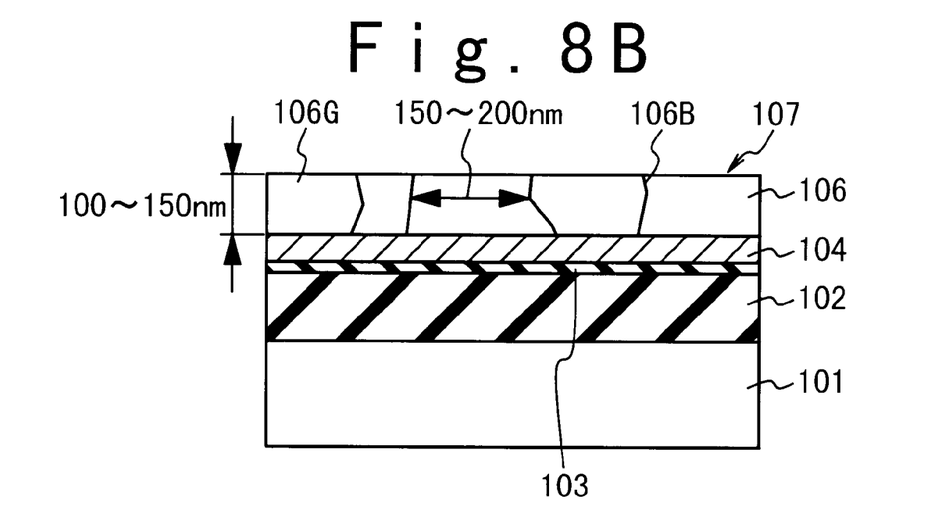

For example, when the present invention is applied to a DRAM as the semiconductor device having a MOS transistor in a memory cell, the gate electrode 107 functions as a word line wiring layer. Therefore, the word line wiring layer 107 is formed as the polycide wiring layer having the polycide structure. Thus, as show in FIGS. 8A and 8B as a plan view and a side view, the WSi layer 106 of the word line 107 has the film thickness of 100 nm to 150 nm and the film width of 100 nm. The WSi grains 106G have the grain diameter of 150 nm to 200 nm. The grain diameter of the WSi grain is larger than the film thickness and the film width of the WSi wiring layer 106. Thus, a distance from an interface 106B between the grains to another interface 106B in the word line 107 is elongated. In this manner, it is sufficient that the grain diameters of a portion of the WSi grains are larger at least one of the film thickness direction of the word line 107 and the film width direction thereof 106B becomes large. Thus, the number of interfaces 106B which crosses in the width direction of the WSi layer 106 is reduced. Also, it can be restrained that the wiring layer resistance is increased due to Si atoms deposited in the interface 106B. As a result, it becomes possible to reduce the resistance of the word line wiring layer 107.

Impurity diffusion layers are formed as source and drain regions on the surface of a silicon substrate, after the word line wiring layer 107 is formed. An interlayer insulating film is formed on the surface of the silicon substrate 101, and then contact holes are formed to connect to the impurity diffusion layers. A semiconductor device such as a DRAM is completed through the above well known processes. However, because the subsequent process is little relation with the present invention, the description of the subsequent process will be omitted.

According to the first embodiment, the WSi grains with the grain size equal to or larger than 150 nm to 200 nm can be formed under the following film formation conditions such as the reaction in the composition ratio of W and Si in a range of 1:2.0 to 1:2.2, and the subsequent rapid thermal annealing process at the temperature equal to or more than 950° C. for 60 seconds. Therefore, even when the polycide wiring layer is requested to have the film thickness of 100 to 150 nm and the film width of 100 nm, it is possible to form a wiring layer in which the WSi grain size is larger than at least one of the film thickness of the WSi wiring layer and the film width thereof. In this way, the polycide wiring layer with a low wiring layer resistance can be realized, so that the semiconductor device with a high gate density can be realized. Also, the number of memory cells connectable with a single word line can be increased. Further, when one word line is divided into a plurality of blocks, the number of blocks can be decreased. Therefore, the number of buffers for driving the word line can be reduced such that the chip size of the memory can be reduced.

Figure 9:
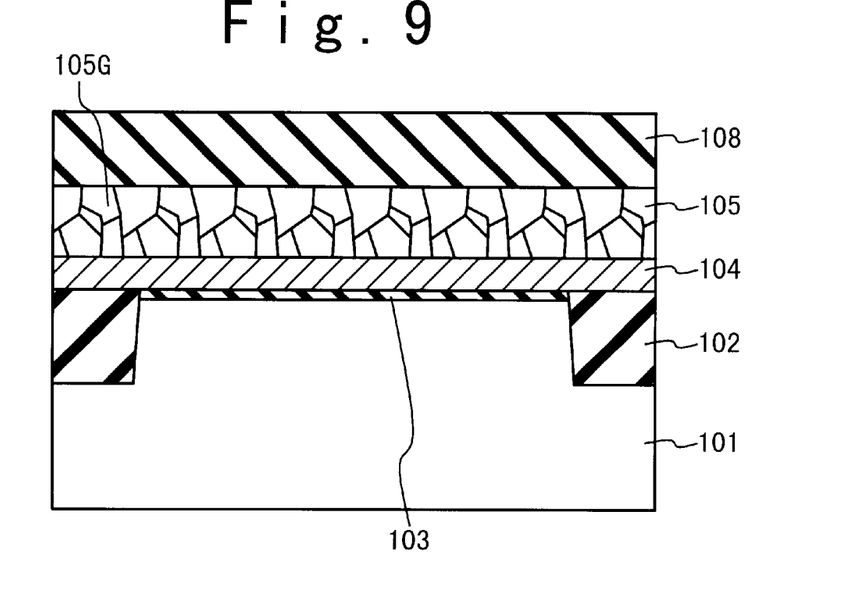
FIG. 9 is a diagram to illustrate the film forming process according to a second embodiment of the present invention.
Figure 10:
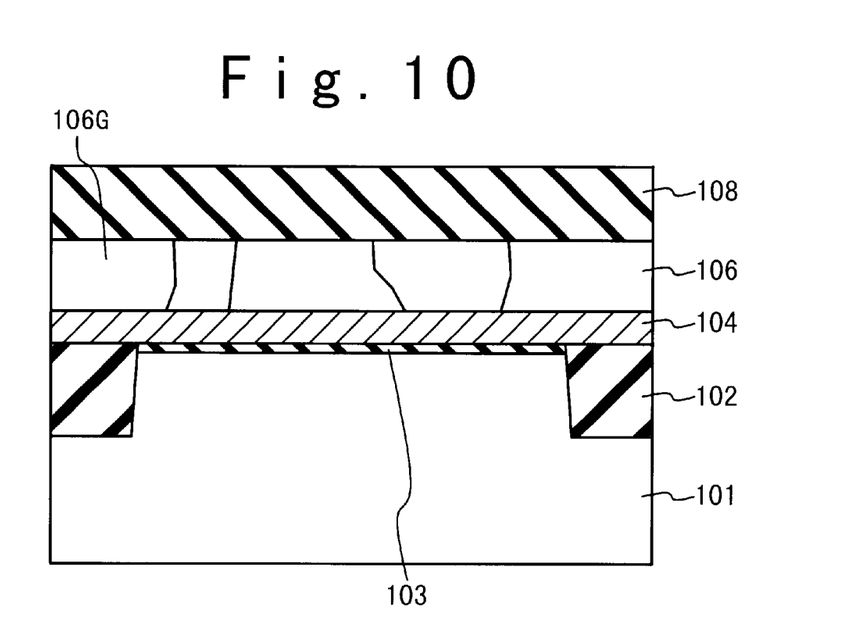
FIG. 10 is a diagram to illustrate the thermal annealing process according to the second embodiment of the present invention.

FIGS. 9 and 10 are cross sectional views of the semiconductor device according to the second embodiments of the present invention to illustrate the processes of forming the WSi layer and carrying out a thermal annealing. It should be noted that the same components as those shown in the first embodiment are allocated with the same reference numerals as those in the first embodiment, respectively.

In the second embodiment, as shown in FIG. 9, the trench separation insulating film 102 is formed on the silicon substrate 101, like the first embodiment. The gate oxide film 103 composed of the silicon oxide film is formed on the surface of the silicon substrate 101 in the element forming region segmented by the trench separation insulating films. Then, the polysilicon film 104 with phosphorus ions doped to decrease the resistance is formed on the gate oxide film by the LP-CVD method to have the film thickness of 100 nm, like the first embodiment. Subsequently, the WSi layer 105 is formed on the polysilicon film 104 by the CVD method to have the film thickness of 150 nm. The film forming condition at this time is as follows: the temperature is in a range of 500 to 550° C. and the pressure is in a range of 80 to 100 Pa, using a mixture gas of $WF_6/SiH_2Cl_2$. Thus, the WSi layer 105 having the composition ratio of W and Si in a rage of 1:2.0 to 1:2.2 is formed. The WSi grains 105 are formed as many needle crystals 105G directed upward from the surface of the polysilicon film 104, as shown in FIG. 9.

Next, a silicon oxide film 108 is formed on the surface of the WSi layer 105 to have the film thickness of about 100 nm such that the silicon oxide film 108 covers the surface of the WSi layer 105. Then, like the first embodiment, a thermal annealing process is carried out to the WSi layer 105 so that the needle crystals 105G are grown to the grains 106G with a larger grain diameter, as shown in FIG. 10. Thus, the WSi layer 106 composed of the grains 106G is formed. In this thermal annealing process, a rapid thermal annealing (RTA) by use of a lamp annealing is performed at the temperature in a range of 950° C. to 1100° C. for 15 to 60 seconds in the nitrogen ambience. The grain diameter of the grains 106G of the WSi layer 106 are grown to be 150 nm 200 nm through the thermal annealing process. Subsequently, although being omitted in the figure, the silicon oxide film 108, the WSi layer 106 and the polysilicon film 104 are collectively patterned into a desired pattern so as to form the polycide wiring layer having the film width of 100 nm.

In the second embodiment, it is possible to form the WSi layer composed of the grains having equal to or larger than 150 nm to 200 nm. When the polycide wiring layer should be formed to have 100 to 150 nm and the film width of 100 nm, the WSi grain can be formed to be larger than at least one of the film thickness of the WSi layer and the film width thereof. Thus, the polycide wiring layer having a low wiring layer resistance can be realized such that the semiconductor device with a high integration density can be realized.

Also, in the second embodiment, since the WSi layer 105 is covered by the silicon oxide film 108 in the thermal annealing process, the WSi grain growth to the thickness direction of the WSi layer is restrained. On the contrary, the WSi grain growth to the plane direction of the WSi layer is promoted. Therefore, the grain size of the grains 106G in the plane direction becomes larger in the annealed WSi layer 106. Especially, the present invention can be applied to the polycide wiring layer when the polycide wiring layer width is restricted.

In the present invention, the grain diameter of each grain of a high melting point metal silicide or refractory metal silicide of the polycide wiring layer such as WSi in all the directions may be not larger than one of the film thickness of the refractory metal silicide and the film width thereof. That is, it is preferable that the grain diameters of all the grains of the high melting point metal silicide are larger than the film thickness and the film width. However, because it is difficult that the grain diameters of all the grains actually meets such a condition. Therefore, if at least one of the grains of the high melting point metal silicide meets the above condition, the advantage of the present invention can be attained.

In he above embodiments, the width of the WSi wiring layer is described to be 100 nm. However, the present invention is not limited to this. It is confirmed that the effect of the present invention can be attained for the wiring layer width of 40 nm to 250 nm.

As described above, according to the present invention, which at least one grain of the high melting point metal silicide laminated on the polysilicon layer in the polycide wiring layer is formed to have the grain size larger than at least one of the film thickness of the high melting point metal silicide and the film width thereof. The state in which the interface between the grains of the high melting point metal silicide is continuous in the direction of the film thickness or the film width is increased. For this reason, even if Si atoms are generated at the interface between the grains, the increase of the wiring layer resistance due to the Si atoms can be restrained. As a result, it is possible to form the polycide wiring layer having a low resistance. Especially, when the present invention is applied to the WSi layer, W and Si are reacted in the composition ratio in a rage of 1:2.0 to 1:2.2, and then a thermal annealing process is carried out at the temperature equal to or higher than 950° C. for 60 seconds by the RTA method. Thus, it is possible to form the WSi layer whose grain has the grain size equal to or more than 150 nm to 200 nm. When the polycide wiring layer is formed to have the film thickness in a range of 100 to 150 nm and the film width in rage of 40 to 250 nm, the polycide wiring layer can be formed such that the WSi grain size is larger than at least one of the film thickness of the WSi layer and the film width. Thus, the semiconductor device with a high integration density and a high speed operation can be realized.

What is claimed is:

1. A semiconductor device comprising:
    a polysilicon film formed directly or indirectly on a semiconductor substrate; and
    a refractory metal silicide film formed on said polysilicon film, and
    wherein said refractory metal silicide film comprises grains of refractory metal silicide, and at least a portion of said grains has a maximum grain diameter equal to or larger than at least one of a film thickness of said refractory metal silicide film and a film width of said refractory metal silicide film.

2. A semiconductor device according to claim 1, wherein said film thickness of said refractory metal silicide is in a range of 100 to 150 nm, said film width of said refractory metal silicide is in a range of 40 to 250 nm, and said maximum grain diameter is in a range of 150 to 200 nm.

3. A semiconductor device according to claim 1, wherein said refractory metal silicide is tungsten silicide (WSi).

4. A semiconductor device according to claim 1, wherein said refractory metal silicide has a sheet resistance in a range of 2 to 4 Ω/□.

5. A semiconductor device according to claim 1, further comprising a gate insulating film formed on said semiconductor substrate, said refractory metal silicide being formed on said gate insulating film, and
    wherein said polysilicon film and said refractory metal silicide function a gate electrode of a MOS transistor and a wiring layer.

6. A semiconductor device according to claim 1, further comprising a coverage film formed on said refractory metal silicide, for suppressing growth of said grains in a direction of said film thickness.

7. A semiconductor device according to claim 6, wherein said coverage film is a silicon oxide film.

8. A semiconductor device comprising:
    a polysilicon film formed directly or indirectly on a semiconductor substrate;
    a refracting metal silicide film formed on said polysilicon film to have a sheet resistance in a range of 2 to 4;
    wherein said refractory metal silicide film comprises grains of refractory metal silicide, a film thickness of said refractory metal silicide is in a range of 100 to 150 nm, a film width of said refractory metal silicide is in a range of 40 to 250 nm, and a maximum grain diameter of said grains is in a range of 150 to 200 nm.

9. A semiconductor device according to claim 8, wherein said refractory metal silicide is tungsten silicide (WSi).

10. A semiconductor device comprising:
    a polysilicon film formed directly or indirectly on a semiconductor substrate;
    a refracting metal silicide film formed on said polysilicon film to have a sheet resistance in a range of 2 to 4;
    wherein said refractory metal silicide film comprises grains of refractory metal silicide, and at least a portion of said grains has a maximum grain diameter equal to or larger than at least one of a film thickness of said refractory metal silicide film and a film width of said refractory metal silicide film.

* * * * *